United States Patent
Samsonov et al.

(10) Patent No.: US 7,397,242 B2
(45) Date of Patent: Jul. 8, 2008

(54) PARALLEL MAGNETIC RESONANCE IMAGING METHOD USING A RADIAL ACQUISITION TRAJECTORY

(75) Inventors: Alexey A. Samsonov, Madison, WI (US); Arjun Arunachalam, Madison, WI (US); Walter F. Block, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 40 days.

(21) Appl. No.: 11/259,802

(22) Filed: Oct. 27, 2005

(65) Prior Publication Data

US 2007/0096732 A1 May 3, 2007

(51) Int. Cl.
 *G01V 3/00* (2006.01)
(52) U.S. Cl. .................. 324/309; 324/307
(58) Field of Classification Search .......... 324/309, 324/307, 318; 600/410
 See application file for complete search history.

(56) References Cited

U.S. PATENT DOCUMENTS

| | | | |
|---|---|---|---|
| 5,910,728 A | 6/1999 | Sodickson | |
| 6,326,786 B1 | 12/2001 | Pruessmann et al. | |
| 6,487,435 B2 * | 11/2002 | Mistretta et al. | 600/420 |
| 6,680,610 B1 | 1/2004 | Kyriakos et al. | |
| 6,710,686 B2 | 3/2004 | Mertelmeier et al. | |
| 6,781,374 B1 * | 8/2004 | Lee | 324/309 |
| 6,828,788 B2 * | 12/2004 | Wang | 324/309 |
| 6,841,998 B1 | 1/2005 | Griswold | |
| 6,876,199 B2 | 4/2005 | Hardy et al. | |
| 6,954,067 B2 * | 10/2005 | Mistretta | 324/307 |
| 7,102,348 B2 * | 9/2006 | Zhang et al. | 324/309 |
| 2001/0027262 A1 * | 10/2001 | Mistretta et al. | 600/9 |
| 2003/0122545 A1 * | 7/2003 | Van Den Brink et al. | 324/309 |
| 2003/0135103 A1 * | 7/2003 | Mistretta | 600/410 |
| 2003/0164701 A1 * | 9/2003 | Wang | 324/307 |
| 2005/0251023 A1 * | 11/2005 | Kannengiesser et al. | 600/410 |
| 2005/0264287 A1 * | 12/2005 | Griswold et al. | 324/309 |
| 2006/0028206 A1 * | 2/2006 | Zhang et al. | 324/309 |
| 2006/0273792 A1 * | 12/2006 | Kholmovski et al. | 324/309 |
| 2007/0096732 A1 * | 5/2007 | Samsonov et al. | 324/309 |

OTHER PUBLICATIONS

Ernest N. Yeh, et al, 3Parallel Magnetic Resonance Imaging With Adaptive Radius In K-space (PARS): Constrained Image Reconstruction Using K-space Locality In Radiofrequency Coil Encoded Data, Magn. Reson. in Med. 53:1381-1892(2005).

Reed A. Omary et al, Comparison Of Intraarterial and IV Gadolinium-Enhanced MR Angiography With Digital Subtraction Angiography for the Detection of Renal Artery Stenosis in Pigs, AJR:178, pp. 119-123, Jan. 2002.

(Continued)

*Primary Examiner*—Brij Shrivastav
*Assistant Examiner*—Tiffany A Fetzner
(74) *Attorney, Agent, or Firm*—Quarles & Brady LLP

(57) ABSTRACT

A fast and efficient method for reconstructing an image from undersampled, parallel MRI data sets acquired with non-Cartesian trajectories includes the calculation of unsampled k-space data from the acquired k-space data and sets of calculated reconstruction coefficients. To reduce the computation time, only a few reference reconstruction coefficients are calculated using a matrix inversion step and the remaining reconstruction coefficients are produced by interpolating between the reference reconstruction coefficients.

5 Claims, 7 Drawing Sheets

OTHER PUBLICATIONS

Klass P. Pruessmann et al, Advances In Sensitivity Encoding With Arbitrary K-space Trajectories, Magn. Reson. in Med. 46:638-651 (2001).

M.A. Griswold et al, Direct Parallel Imaging Reconstruction of Radially Sampled Data Using GRAPPA with Relative Shifts, Proc. Intl. Soc. Mag. Reson. Med. 11 (2003).

* cited by examiner

FIG. 2
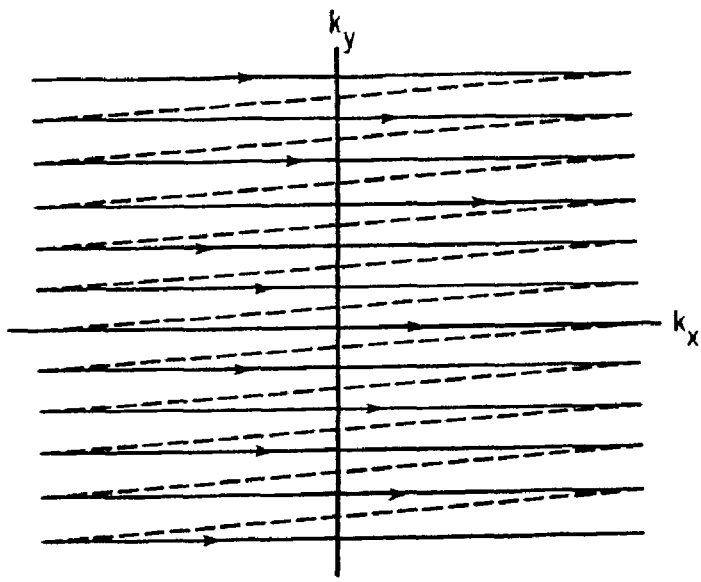
PRIOR ART
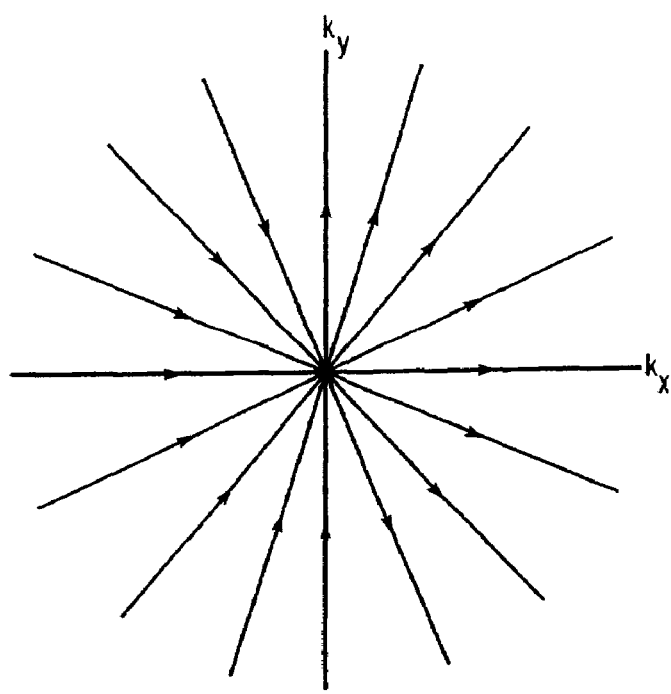
FIG. 3
PRIOR ART

PARALLEL MAGNETIC RESONANCE IMAGING METHOD USING A RADIAL ACQUISITION TRAJECTORY

STATEMENT REGARDING FEDERALLY SPONSORED RESEARCH

This invention was made with government support under Grant No. EB002075 awarded by the National Institute of Health. The United States Government has certain rights in this invention.

BACKGROUND OF THE INVENTION

The field of the invention is magnetic resonance imaging and more particularly parallel imaging methods using a plurality of acquisition coils.

When a substance such as human tissue is subjected to a uniform magnetic field (polarizing field B0), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$, is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The most commonly used technique, which is frequently referred to as "spin-warp" or "Fourier imaging" employs a pulse sequence that samples Fourier space, or "k-space" in Cartesian coordinates. This technique is discussed in an article entitled "Spin-Warp NMR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed. In a 3D FT scan a second phase encoding gradient ($G_z$) is also employed, and it too is stepped through a sequence of views for each value of the first phase encoding gradient ($G_y$).

Most NMR scans currently used to produce medical images require many minutes to acquire the necessary data. The reduction of this scan time is an important consideration, since reduced scan increases patient throughput, improves patient comfort, and improves image quality by reducing motion artifacts. There are many different strategies being used to shorten the scan time and the present invention relates to two of these.

As disclosed in U.S. Pat. No. 6,630,828 entitled "Rapid Acquisition Magnetic Resonance Imaging Using Radial Projections" and U.S. Pat. No. 6,487,435 entitled "Magnetic Resonance Angiography Using Undersampled 3D Projection Imaging", k-space can be sampled with radial trajectories rather than rectilinear trajectories as is done with spin-warp methods that employ phase encoding. This is illustrated for 2D imaging in FIGS. 2 and 3, where FIG. 2 illustrates the conventional rectilinear sampling of k-space where a $G_y$ phase encoding is employed and FIG. 3 illustrates radial k-space sampling where the sampling trajectories all pass through the center of k-space and extend radially outward therefrom. The advantage of the latter method is that the image artifacts that are produced (when fewer views are acquired and k-space is not fully sampled according to the Nyquist criteria) are not as troubling to a diagnostician as the artifacts produced when a rectilinear method undersamples to the same extent. In other words, scan time can be reduced more by undersampling with a radial k-space sampling pattern than with the more conventional rectilinear sampling pattern.

A second technique that is used to shorten scan time is referred to generally as a "parallel imaging technique". Such "pMRI" techniques use spatial information from arrays of RF detector coils to substitute for the encoding which would otherwise have to be obtained in a sequential fashion using field gradients and RF pulses. The use of multiple effective detectors has been shown to multiply imaging speed, without increasing gradient switching rates or RF power deposition.

Parallel imaging techniques fall into one of two categories. They can fill in the omitted k-space lines prior to Fourier transformation, by constructing a weighted combination of neighboring lines acquired by the different RF detector coils. Or, they can first Fourier transform the undersampled k-space data set to produce an aliased image from each coil, and then unfold the aliased signals by a linear transformation of the superimposed pixel values. In either case, the reconstructed images tend to suffer from incomplete removal of aliasing artifacts, especially for large speedup factors. In images corrupted by aliasing, the edges of the image are wrapped into the center of the image.

Two such parallel imaging techniques that have recently been developed and applied to in vivo imaging are SENSE (SENSitivity Encoding) and SMASH (simultaneous acquisition of spatial harmonics). Both techniques include the parallel use of a plurality of separate receiving coils, with each coil having a different sensitivity profile. The combination of the separate NMR signals produced by these coils enables a reduction of the acquisition time required for an image (in comparison with conventional Fourier image reconstruction) by a factor which in the most favorable case equals the number of the receiving coils used as explained by Pruessmann et al., Magnetic Resonance in Medicine Vol. 42, p. 952-962, 1999.

For pulse sequences that execute a rectilinear trajectory in k-space, parallel imaging techniques invariably reduce the number of phase encoding steps in order to reduce imaging time, and then use the coil sensitivity information to make up for the loss of spatial information.

As explained above, undersampled non-Cartesian acquisitions such as spirals and radial sampling can acquire high resolution images quickly in such applications as real-time cardiac imaging and time-resolved contrast-enhanced MRA.

Applying parallel imaging techniques could reduce further the undersampling artifacts to allow even shorter scan times than are currently available. However, in a non-Cartesian acquisition, a pixel may alias throughout a significant portion of the image volume and thus unaliasing the pixels using a PMRI technique is a different and more difficult task.

The SENSE technique has been applied to non-Cartesian trajectories by Pruessmann K P, Weiger M, Scheidegger M B, Boesiger P., "Advances In Sensitivity Encoding With Arbitrary K-Space Trajectories," Magn Reson Med, 2001; 46: 638-651; and Kannengiesser S A R, Brenner A R, Noll T G. "Accelerated Image Reconstruction For Sensitivity Encoded Imaging With Arbitrary K-Space Trajectories." Proceedings of the 8th Annual Meeting of ISMRM, Denver, 2000, p 155. Here the solution to an intractable matrix inversion is required and this is accomplished by iteratively using the Conjugate Gradient method. Though processing is tractable using this method, the processing becomes especially demanding for 3D imaging applications, and real-time applications are currently infeasible.

An important advance to efficient pMRI processing with non-Cartesian trajectories is a technique known as radial GRAPPA introduced by Griswold M A, Heidemann R M, Jakob P M., "Direct Parallel Imaging Reconstruction Of Radially Sampled Data Using GRAPPA With Relative Shifts.," Proceedings of the ISMRM 11$^{th}$ Scientific Meeting, Toronto, 2003: 2349. Original Generalized Autocalibrating Partially Parallel Acquisition (GRAPPA) determines a linear combination of individual coil data to create missing lines of k-space. The method determines the coefficients for the combination by fitting the acquired data to some oversampled data near the center of k-space.

With radial GRAPPA a preliminary scan is first performed to acquire "training data" that is used to estimate the missing radial data. This training data can then be used throughout a real-time scan to estimate unsampled radial lines with little processing. Using a large coil array, cardiac imaging with image quality equivalent to acquiring 96 radial sample trajectories per frame was achieved by acquiring as few as eight radial sample trajectories per frame. These techniques have also been successfully adapted to 3D radial sampling. However, radial GRAPPA requires the acquisition of high quality fully sampled training data, which often requires extensive signal averaging. Such a lengthy acquisition may be impractical in contrast enhanced dynamic studies.

A technique known as "PARS" described by Yeh E N, McKenzie C A, Ohliger M A, Sodickson D K, "Parallel Magnetic Resonance Imaging With Adaptive Radius In k-Space (PARS): Constrained Image Reconstruction Using k-Space Locality In Radiofrequency Coil Encoded Data," Magn Reson Med, in press uses the idea of k-space locality for efficient implementation of pMRI reconstruction for arbitrary sampling trajectories. The k-space locality principle assumes that only a few nearby points contribute to the sample being synthesized. This assumption allows avoiding computational problems associated with direct inversion of large encoding matrices. Instead, the method employs numerous inversions of much smaller matrices. Using the k-space locality constraint also improves numerical conditioning and reduces noise amplification in the reconstructed images. However, typical reconstruction times of PARS are still too long for many applications that require fast reconstruction.

SUMMARY OF THE INVENTION

The present invention is a method for producing an image from a plurality of undersampled k-space data sets acquired in parallel with an MRI system using a pulse sequence that samples k-space with radial trajectories. It includes reconstructing coil images from the plurality of undersampled k-space data sets; producing coil sensitivity maps using the coil images; calculating a set of reference reconstruction coefficients for each coil using undersampled coil k-space data and its coil sensitivity map; calculating additional reconstruction coefficients for each coil by interpolating between calculated reference coefficients; calculating additional k-space data for each coil using the reference reconstruction coefficients, the additional reconstruction coefficients and acquired k-space data; reconstructing coil images from the acquired k-space data and the calculated additional k-space data; and combining the reconstructed coil images.

An object of the invention is to reduce the processing burden when using the GRAPPA and PARS methods for radial trajectories. Rather than performing a matrix inversion for the calculation of each reconstruction coefficient, only a few judiciously located reference reconstruction coefficients are calculated in this manner. Instead, a less burdensome interpolation calculation is used to produce the vast majority of the reconstruction coefficients from the reference reconstruction coefficients.

BRIEF DESCRIPTION OF THE DRAWINGS

FIG. 2 is a graphic illustration of a Cartesian, or rectilinear, k-space sampling pattern which may be used on the MRI system of FIG. 1;

FIG. 3 is a graphic illustration of a radial k-space sampling pattern

GENERAL DESCRIPTION OF THE INVENTION

Figure 1:
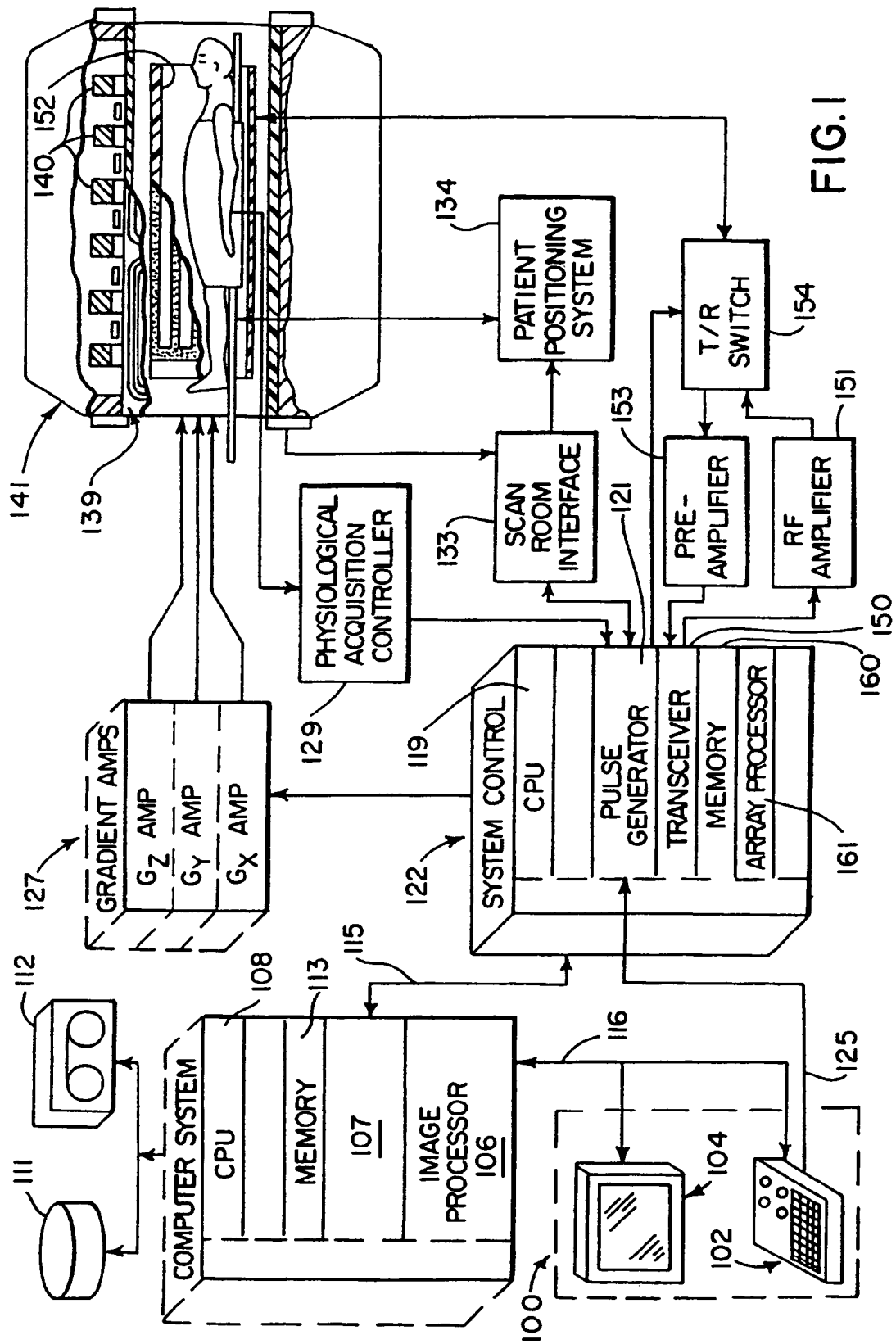
FIG. 1 is a block diagram of an MRI system which is programmed to practice a preferred embodiment of the invention.

The PARS PMRI technique described above requires a calibration scan in which MRI data is acquired from which coil sensitivity maps may be produced. The $\gamma^{th}$ receiver coil of $N_c$, with sensitivity $c_\gamma(r)$, $\gamma=1, \ldots, N_c$, collects signal from an object f (r) over a volume of interest (VOI) which can be represented by:

$$s_\gamma(k) = \int_{VOI} e^{ik \cdot r} c_\gamma(r) f(r) dr \tag{1}$$

The k-space samples are acquired at positions denoted as $k_m$. Let $\Re$ denote the set of unacquired k-space points to be determined by using the PARS technique. PARS chooses $\Re$ as a Cartesian grid that provides a prescribed FOV and resolution. For the n$^{th}$ point in $\Re$, let $\eta_n$ be the set of local k-space samples participating in the reconstruction of $k_n$. We also refer to η as local neighborhood, and points in ℜ as reconstruction points. For every receiver coil, PARS calculates the signal at each unacquired k-space point by linearly combining the MRI signal from all coil k-space data samples within the radius R:

$$s_\gamma(k_n) = \sum_{m \in \eta_{n,R}} \sum_{\gamma'=1}^{N_C} w_{m,\gamma'}^{(\gamma)} s_{\gamma'}(k_n - \Delta k_m), \quad (2)$$

where $s_{\gamma'}(k_n - \Delta k_m)$ is $\gamma^{th}$ coil data acquired at relative shift $\Delta k_m = k_n - k_m$ fr $w_{m,\gamma'}^{(\gamma)}$, are reconstruction coefficients for the $\gamma^{th}$ receive coil ordered in the column vector $w_\gamma$, $\eta_n$,R=[m: 2Δk$_m$2≦k$_r$], and 2.2 is Euclidian distance. Individual coil datasets are reconstructed for each point in ℜ using equation (2). The regenerated coil datasets are transformed from k-space to image space and then combined using one of the standard multicoil data combination techniques to form an estimate of f(r). We note that the procedure given in equation (2) may be considered as a convolution of multichannel data with a shift variant multidimensional kernel. The vectors of reconstruction coefficients $w_\gamma$ are obtained solving this system of equations:

$$c_\gamma^T = w_\gamma^T E, \quad (3)$$

where $c_\gamma$ is a column vector representation of $C_\gamma(r)$, and elements of matrix E are given by:

$$[E]_{(m,\gamma),\rho} = e^{-\Delta k_m \cdot \rho} c_\gamma(r_\rho) \quad (4)$$

Here, ρ is the image space index. The PARS coefficients may be found by calculating the pseudoinverse of E:

$$w_\gamma^T = c_\gamma^T E^H (EE^H)^{-1}. \quad (5)$$

We have recognized a connection between the PARS technique and the GRAPPA technique which leads to very useful results. The left-hand side of equation (3) resides in the image domain. By right-multiplying equation (3) by the discrete Fourier transformation matrix that maps image space to an arbitrary set of k-space positions A, we transfer the problem from image domain to k-space. In $$\tilde{c}_\gamma = \tilde{E} w_\gamma \quad (6)$$

$\tilde{c}_\gamma$ is a column vector representation of $\tilde{c}_\gamma(k)$, the Fourier domain of $c_\gamma(r)$, defined at all k-space positions l∈Λ. The elements of matrix $\tilde{E}$ are values of $\tilde{c}_\gamma(k)$:

$$[\tilde{E}]_{l,(m,\gamma)} = \tilde{c}_\gamma(k_l - \Delta k_m). \quad (7)$$

Hence, construction of $\tilde{E}$ amounts to resampling $\tilde{c}_\gamma(k)$, which may be efficiently implemented using an inexpensive interpolation operation such as gridding. It follows from equations (6) and (7) that the set of k-space positions A may be chosen arbitrarily as long as matrix $\tilde{E}$ stays over-determined.

In vivo coil sensitivity provides a convenient way for pMRI self-calibration. A connection between PARS and GRAPPA can be drawn by modeling self-calibrated PARS reconstruction. The in vivo sensitivity represents the true coil sensitivity modulated by the object function:

$$\sigma_\gamma(r) = c_\gamma(r) f(r). \quad (8)$$

It may be approximated from a densely sampled k-space center available for many different k-space sampling trajectories such as radial and variable density spirals. By substituting in vivo sensitivities into equation (3), and applying the Fourier transformation, we obtain:

$$\sigma_\gamma^T = w_\gamma^T E_\sigma, \quad (9)$$

where $\sigma_\gamma^T$ is column representation of in vivo sensitivity, and $$[E_\sigma]_{(m,\gamma),\rho} = e^{-i\Delta k_m \cdot r_\rho} C_\gamma(r_\rho). \quad (10)$$

Applying the Fourier transformation to equation (9) gives $$S_\gamma = \tilde{E}_s w_\gamma, \quad (11)$$

where $s_\gamma$ is a column vector of signal values obtained by the $\gamma^{th}$ coil and $$[\tilde{E}_s]_{l,(m,\gamma)} = s_\gamma(k_l - \Delta k_m) \quad (12)$$

Figure 4:
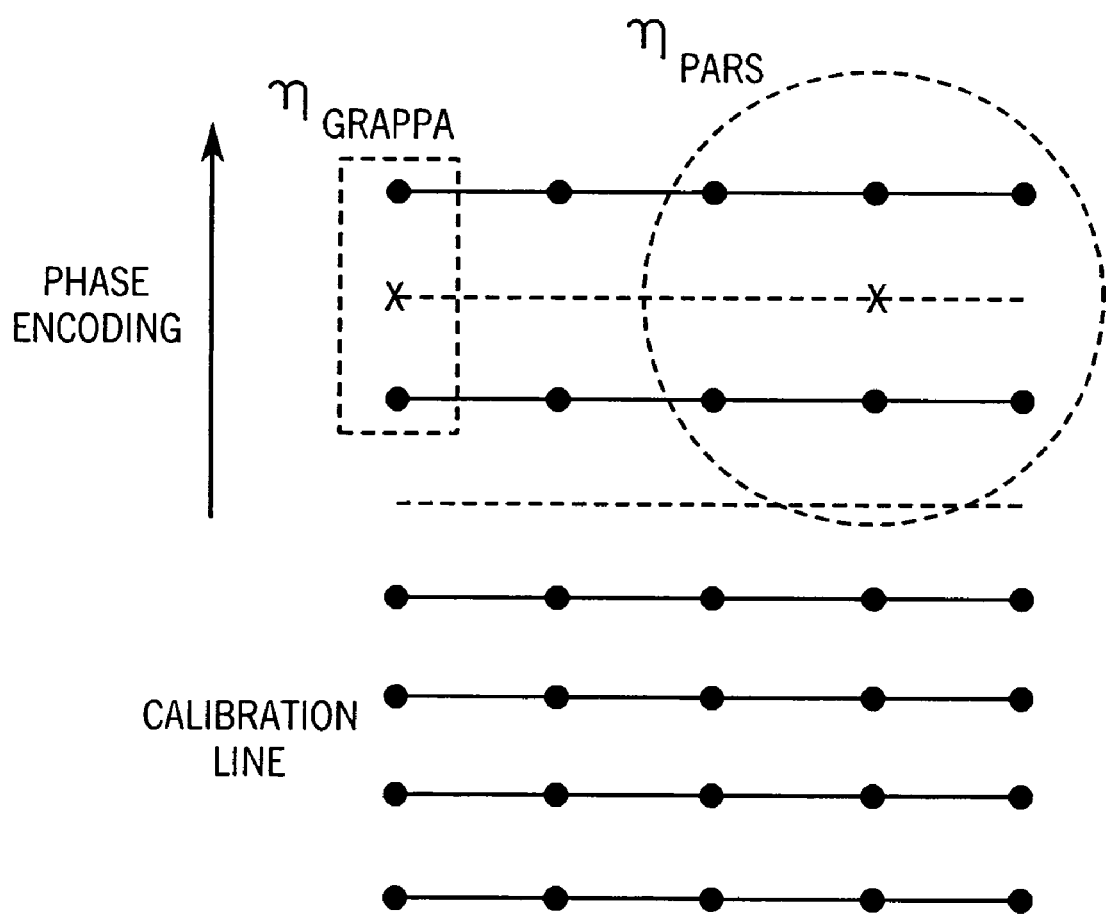
FIG. 4 is a pictorial representation of k-space data samples used to explain the invention.

Solving for $w_\gamma$ in equation (11) is equivalent to fitting the acquired k-space data, contained in $E_s$, to the autocalibration signal (ACS) represented by $s_\gamma$. Choosing $s_\gamma$ as samples belonging to GRAPPA calibration lines, and restricting the PARS neighborhood to include only a few nearest neighbors in the phase-encode direction as shown in FIG. 4, we notice that equation (11) becomes equivalent to the GRAPPA equation (2) described by Griswold M A, Jakob P M, Heidemann R M, Nittka M, Jellus V, Wang J, Kiefer B, Haase A. in "Generalized Autocalibrating Partially Parallel Acquisition (GRAPPA)," Magn Reson Med, 2002; 47:1202-1210. In radial GRAPPA, solving the equation is equivalent to fitting the collected radial data to the extra projections acquired in the training scan.

Equation (9) may be rewritten as $$c_\gamma^T W_{f1} = w_\gamma^T E W_f,$$

where $W_f$ is a diagonal matrix with values of f(r) along the main diagonal. Therefore, finding reconstruction weights using in vivo sensitivities is equivalent to solving the following optimization problem:

$$\min_{w_\gamma} \|(c_\gamma^T - w_\gamma^T E) W_f\|_2 \quad (14)$$

which is essentially the weighted LMS estimation of $w_\gamma$ with the weighting given by the object function f(r), and $\|.\|_2$ is L2-norm. The expression $\|(c_\gamma^T - w_\gamma^T E) W_f\|_{equation~(14)}$ gives the contribution of a given reconstruction point to the error energy in the $\gamma^{th}$ coil image, which manifests itself as residual aliasing. The error arises due to the approximate nature of the PARS technique. As such, the reconstruction weights produced by PARS using in vivo sensitivities and GRAPPA minimize the power of residual aliasing in the given object and, hence, are optimal for reconstruction of the corresponding object within the framework of k-space locality.

Weighting strategies other than object intensity weighting may be also useful. The general weighted-PARS reconstruction is given by:

$$\min_{w_\gamma} \|(c_\gamma^T - w_\gamma^T E) W\|_2, \quad (15)$$

where W is the weighting matrix that absorbs contributions of the selected data weighting strategies. For example, information about object support was found useful to reduce reconstruction errors in SENSE reconstruction. Utilization equation (15) allows including this information into PARS reconstruction by setting corresponding values of W to 0 for background areas and to 1 for the rest of the image. The weighted estimation can also be implemented in k-space by similar modification of the corresponding equations (equations (6) and (7)).

Figure 5A:
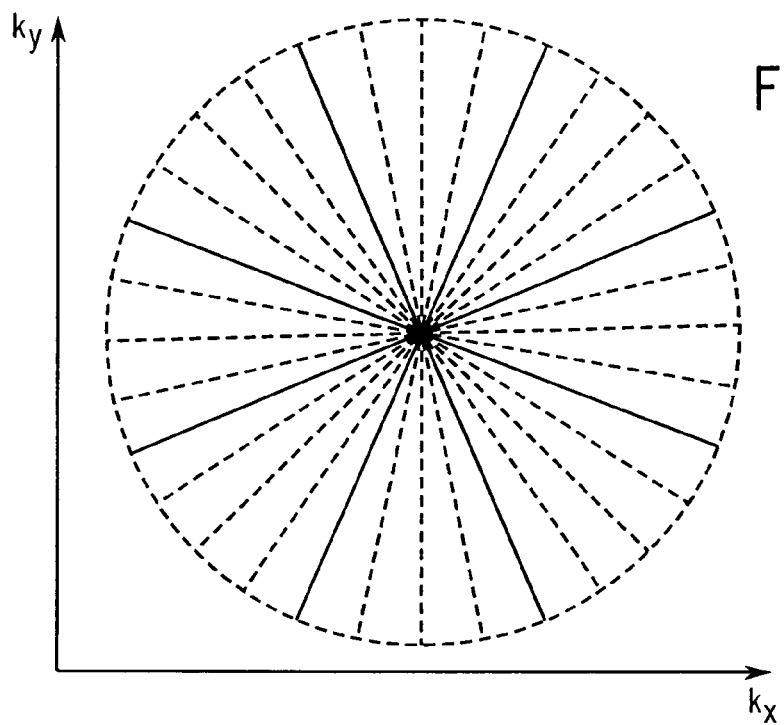
FIG. 5$a$ and FIG. 5$b$ are exemplary k-space sampling patterns used to explain the invention.

The present invention is a method based on the above recognition. In the original PARS technique, $\Re$ is chosen to be a Cartesian grid. Such a choice permits PARS to avoid sampling density compensation and gridding operations widely used for non-Cartesian MRI data reconstruction. The invented method sacrifices this PARS feature in favor of a more efficient reconstruction described below. We choose $\Re$ to contain the missing elements of the original trajectories such as radials for PR trajectory and interleaves for spiral trajectories. Such an approach allows reusing acquired k-space data samples and minimizing the total number of matrix inversions needed for a PARS reconstruction. The particular configuration of $\Re$ may be adaptive to fulfill the local Nyquist criterion, as shown in FIG. 5(a).

Figure 6A:
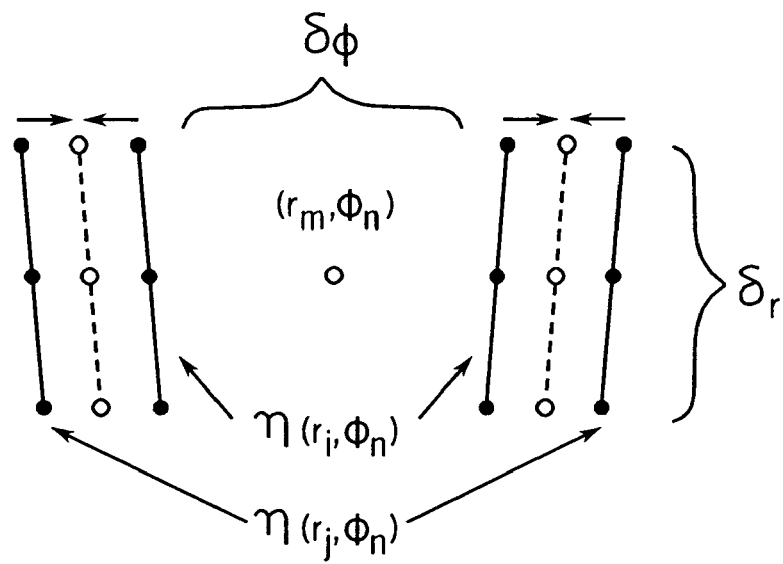
FIG. 6$a$ and FIG. 6$b$ are pictorial representations of k-space locations used in computational steps when practicing the present invention.

Furthermore, the choice of $\Re$ enforces similarity of the local neighborhood $\eta$ for different reconstruction points. By the similarity, we mean that the set of relative shifts $\Delta k$ corresponding to the local neighborhood $\eta$ differ insignificantly for each two given reconstruction points. For radial trajectories, we use the configuration of $\eta$ shown in FIG. 6a. It is described by two parameters, the width in the radial direction $\delta_r$, and the width in the azimuthal direction $\delta_\phi$. For radial trajectories, the similarity property is retained within a short distances along the radial and azimuthal directions. In turn, reconstruction weights depend on the set of the relative shifts $\Delta k$ for the given configuration of $\eta$ as indicated above in equation (2). As the shifts $\Delta k$ change smoothly and coherently along the radial and azimuthal directions, this property allows interpolating reconstruction weights from reference sets of weights precalculated for a few reference points.

An exemplary method for practicing the present invention with k-space data acquired using a radial sampling trajectory will now be described.

Figure 6B:
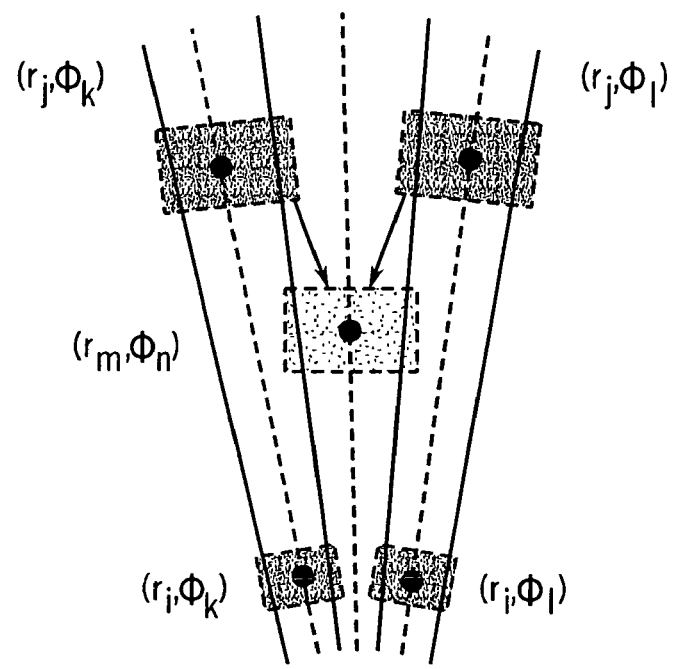

Step 1: Calculate reconstruction weights from the highly undersampled k-space data acquired from each coil for several reference points (m, +n) distributed in both the radial and azimuthal directions. One such reference point is illustrated in FIG. 6b along with the undersampled k-space data samples used to produce it.

Step 2: Obtain reconstruction weights by interpolating between the reference weights calculated in Step 1 for points along the same radial trajectory and along the azimuthal direction reconstruct missing points for each coil k-space data set.

Step 3: Reconstruct individual images from each more fully sampled coil k-space data set.

Step 4: Combine the individual coil images.

Figure 5B:
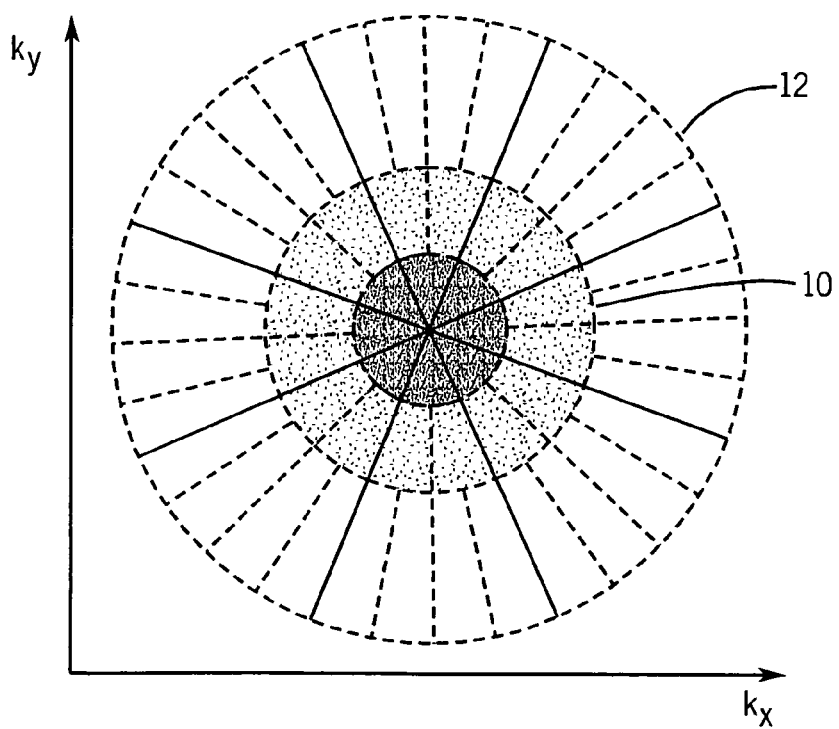

In this example, a Nyquist-optimized choice of reconstruction points as illustrated in FIG. 5(b) is employed, where no additional k-space data is calculated within the k-space radius where the Nyquist criterion is met (Nyquist radius) as indicated by dotted line 10. The missing segments start at the boundary 10 of the Nyquist radius and extend radially outward to the k-space edge 12. In the Step 1, reference points are chosen according to a predefined heuristic, which takes into account the trajectory symmetry. The reference points are uniformly distributed in the given radial segment starting from Nyquist radius 10 and along azimuthal directions. Parameter $a_r$ is defined as the ratio of the total number of k-space sample points to reconstruct on a given radial segment to the number of reference points in the segment, and refers to the processing time acceleration factor to be achieved for reconstruction in the radial direction. Parameter $a_\phi$ is defined as the ratio of the total number of angular directions to be calculated to the number of radial segments for which reference points are calculated. This ratio refers to the processing time acceleration factor to be achieved for reconstruction in the azimuthal direction. The total reconstruction acceleration factor is equal to the product of these ratios $a_r a_\phi$.

In Step 2 of the method, we used linear interpolation, although other interpolation methods can be employed. Following the notation used in FIG. 6b, let the pair (m, n) index the $m^{th}$ point on the $n^{th}$ radial segment. The weights to reconstruct a point (m, n) are approximated by linearly combining the reconstruction coefficients for the reference points (i, k), (i, l), (j, l) and (j, l). For the 2D case, this interpolation step is given by:

$$w_\gamma^{(m,n)} = \lambda_\phi (\lambda_r w_\gamma^{(i,k)} + (1-\lambda_r) w_\gamma^{(j,k)}) + \qquad (16)$$
$$(1-\lambda_\phi)(\lambda_r w_\gamma^{(i,l)} + (1-\lambda_r) w_\gamma^{(j,l)}), \gamma = 1, \ldots, n_C$$
$$\lambda_r = \frac{m-i}{j-i}, \lambda_\phi = \frac{n-k}{l-k}.$$

DETAILED DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of Gx, Gy and Gz amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient are typically sensed by the same RF coil 152 and coupled through the transmit/receive switch 154 to a preamplifier 153, however, in the preferred embodiment a multiple coil array designed for pMRI use is employed. As described in U.S. Pat. No. 6,876,199 for example, such pMRI coil arrays are comprised of a set of local coils designed to have a receptivity field centered over a particular portion of the anatomy being image. The amplified NMR signals produced by each local coil in the array are demodulated, filtered, and digitized by a separate receive channel in the receiver section of the transceiver 150.

The NMR signals picked up by each RF local coil are digitized by the transceiver module 150 and transferred to a memory module 160 in the system control 122. When the scan is completed and an entire array of data has been acquired in the memory module 160, an array processor 161 is employed according to the teachings of the present invention to transform, or reconstruct, the acquired k-space data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

When the pulse generator module 121 is programmed to perform a 2D radial acquisition as described, for example, in U.S. Pat. No. 6,630,828, or a 3D radial acquisition as described for example, in U.S. Pat. No. 6,487,435, the digitized NMR signals from each local coil in the coil array sample k-space with radial trajectories as illustrated in FIG. 3. Each repetition of the pulse sequence samples another radial trajectory to increase the sampling density. While the increased sampling density reduces artifacts caused by undersampling k-space, the corresponding increase in pulse sequence repetitions lengthens the total scan time. As will now be described in detail, the present invention enables the information in the highly undersampled k-space data sets produced by the separate local coils to be combined to produce a more fully sampled k-space data set for each coil. An image with reduced artifacts can thus be reconstructed from these more fully sampled coil k-space data sets without increasing scan time.

The method may be used in a variety of clinical applications and the particular application will determine such details as the particular pulse sequence used to acquire the k-space image data. In a real-time MR interventional application, for example, the method is practiced solely on the MRI system and the reconstructed frame images are produced as quickly as possible to help guide a medical procedure. On the other hand, in a CEMRA application the MRI system is employed to acquire a mask image, the contrast agent is administered to the subject and then k-space data for a succession of image frames are acquired during the uptake of the contrast agent in the region of interest. In this CEMRA application the acquired k-space data may be downloaded to a separate workstation which is programmed to practice the present invention.

Figure 7:
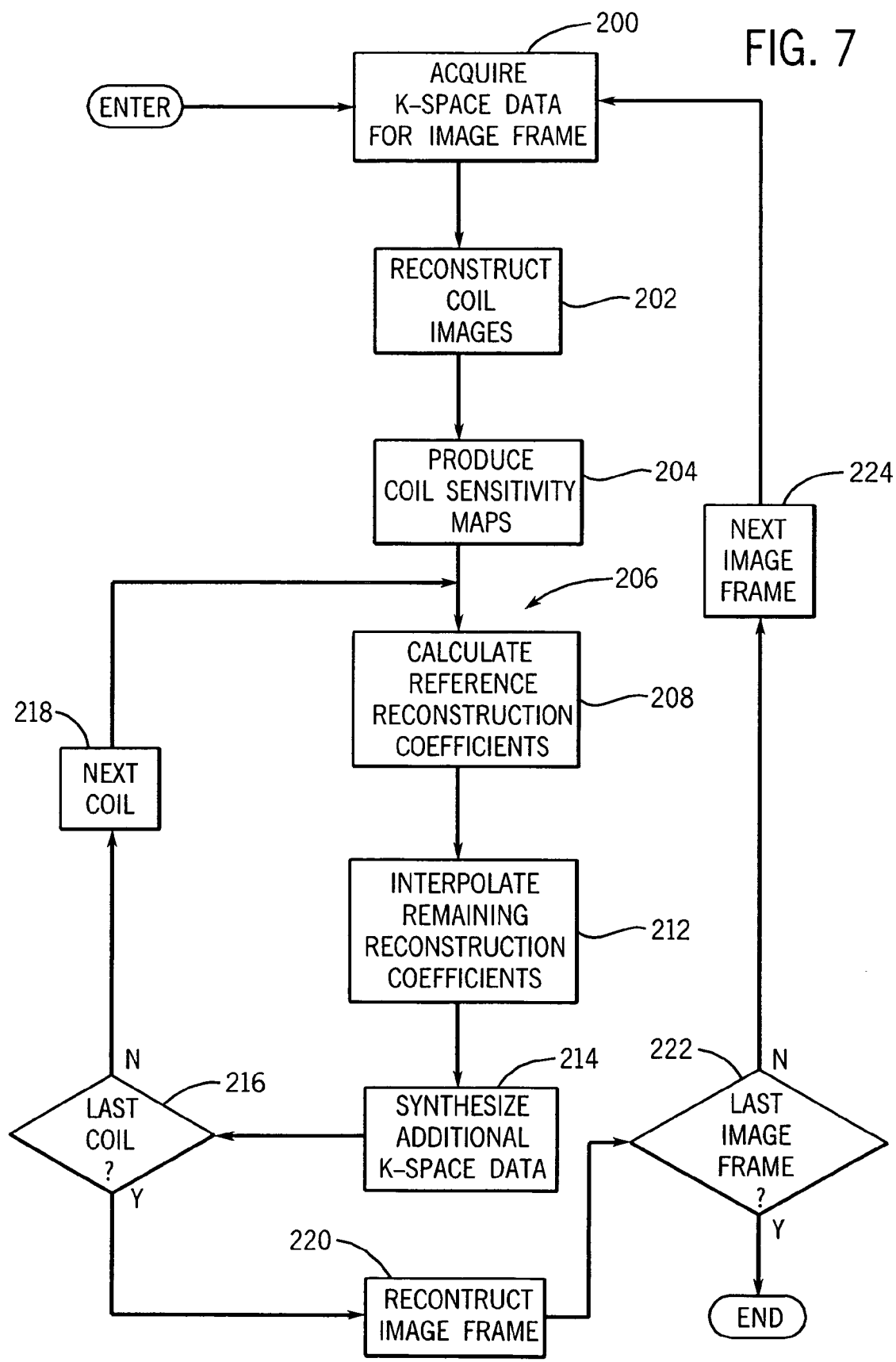
FIG. 7 is a flow chart which sets forth the steps used to practice a preferred embodiment of the present invention.

Referring particularly to FIG. 7, a real-time embodiment of the invention is shown in which the k-space data for one image frame is acquired as described above at process block 200. The k-space data set for each coil is highly undersampled, but there is a region around the center of k-space which is sufficiently sampled such that significant artifacts are not produced if an image is reconstructed with this central region k-space data. As indicated at process block 202, a low resolution coil image is reconstructed for each coil using the k-space data from this central region. This is a conventional image reconstruction in which the radial k-space samples are regridded into Cartesian coordinates and then Fourier transformed.

As indicates at process block 204, the next step is to produce coil sensitivity maps for each coil in the array. To accomplish this a composite image is first reconstructed using the complete acquired coil k-space data sets for the current image frame. First, an image is reconstructed from each complete undersampled coil data set using the regridding and Fourier transformation method described above, and then the separate coil images are combined using the well known square root of sum-of-squares method described by Roemer P B, Edelstein W A, Hayes C E, Souza S P, Mueller O M, "The NMR Phased Array", Magn. Reson. Med., 1990; 16:192-225. A coil sensitivity map is then produced for each coil by dividing each low resolution coil image by the composite image. This is a pixel-by-pixel division of the pixel intensity, or signal magnitude, by the intensity of the corresponding pixel in the composite image.

Figure 8A:
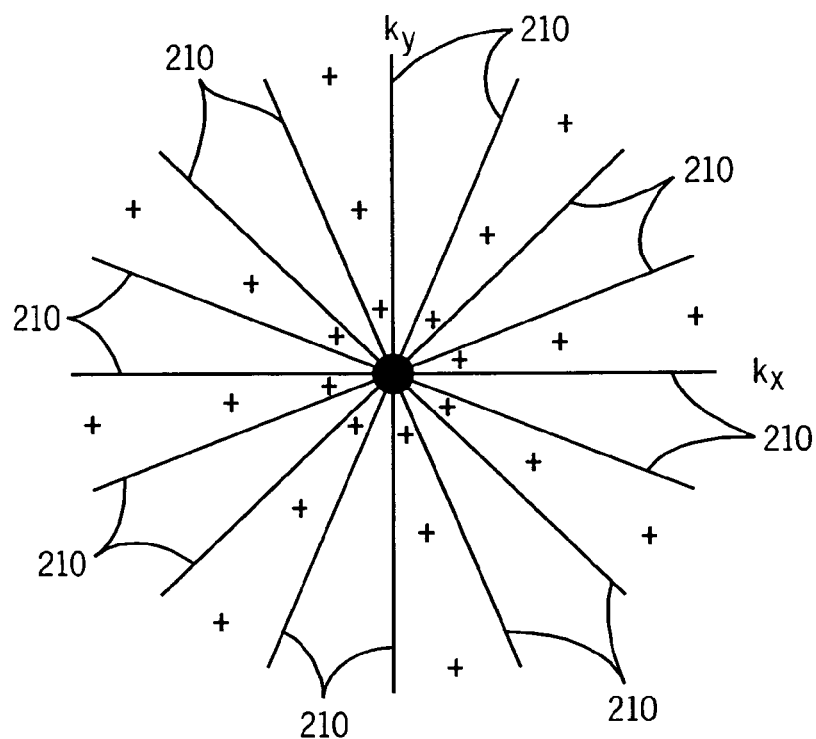
FIGS. 8$a$ and 8$b$ are pictorial representations of an exemplary reconstruction coefficient pattern used to practice the preferred embodiment of this invention.
Figure 8B:
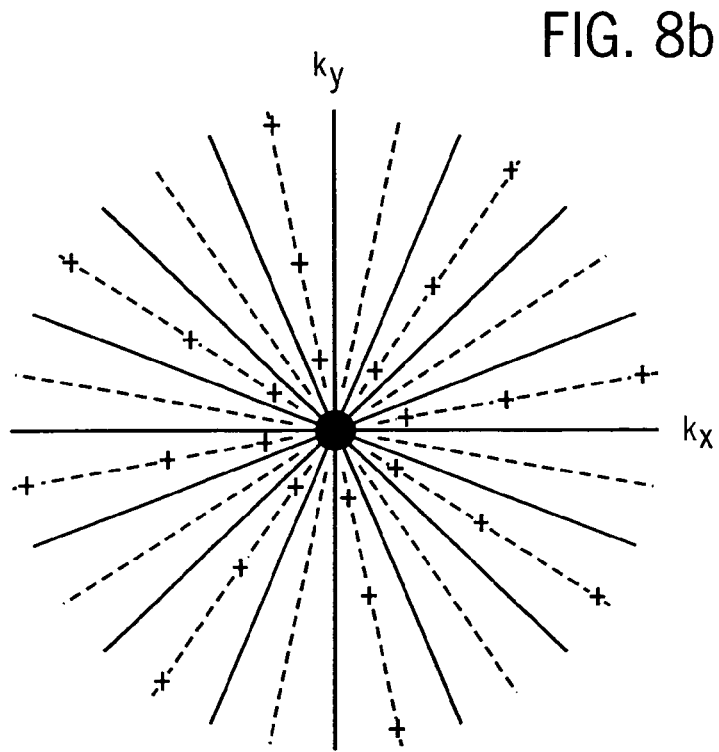

As indicated generally in FIG. 7, a loop is then entered at 206 in which a more fully sampled k-space data set is produced for each coil. This is a modified PARS method discussed above and the first step in this process is to calculate reference reconstruction coefficients for one coil as indicated at process block 208. This calculation can be made in real space or in k-space, but in the preferred embodiment it is made with a matrix E formed using the coil sensitivity maps as indicated above in equation (4). The reference reconstruction coefficients are found by calculating the pseudoinverse of matrix E as set forth above in equation (5). This is a burdensome calculation and it is one of the teachings of the present invention that the number of calculated reference reconstruction coefficients may be kept to a minimum if their location is judiciously selected The number and locations of the calculated reference reconstruction coefficients will depend on the particular clinical application. One exemplary embodiment is illustrated in FIGS. 8(*a*) and 8(*b*). Referring to FIG. 8(*a*), in this exemplary embodiment a set of radial projections indicated by solid lines 210 are acquired by each coil during the scan and it is desired to double the number of radial projections by synthesizing the radial projections located midway between the acquired trajectories 210. To do this, three reference reconstruction coefficients are calculated as described above for every other radial trajectory to be synthesized as indicated by the "+" signs. In this example, therefore, only twenty-four reference reconstruction coefficients need be calculated using this inversion process in equation (5).

Referring particularly to FIG. 7, the next step is to interpolate the remaining reconstruction coefficients as indicated at process block 212. This is performed according to equation (16) above using as inputs the reference reconstruction coefficients. As shown in FIG. 8(*b*), interpolated reconstruction coefficients are calculated for each k-space location where k-space data is to be synthesized. Interpolation is thus done in the radial direction between calculated reference reconstruction coefficients (+) and in the azimuthal direction between reference reconstruction coefficients (+).

Referring again to FIG. 7, the k-space data for the missing radial trajectories is now calculated as indicated at process block 214. This is done using the acquired k-space samples from all the coils and the calculated reconstruction coefficients in accordance with equation (2) discussed above. As a result, a more completely sampled k-space data set is produced for one coil. In the example of FIGS. 8(*a*) and 8(*b*), the result is a k-space data set with twice the number of radial projections. A check is then made at decision block 216 to determine if additional coil k-space data sets are to be processed, and if so, the system loops back to synthesize k-space data for the next coil as indicated at block 218.

After k-space data has been synthesized for all the coil k-space data sets, an image frame is reconstructed from them as indicated at process block 220. This can be done in a number of ways, but in the preferred embodiment each coil k-space data set is regridded onto Cartesian coordinates and a 2D or 3D Fourier transformation is performed as appropriate to produce a 2D or 3D coil image. The separate coil images are then combined by the above-described sum-of-squares method. The image frame is thus constructed and displayed and if additional image frames are to be acquired as indicated at decision block 222, the system loops back through block 224 to repeat the process. However, during the processing of subsequent image frames the reference reconstruction coefficients need not be recalculated at process block 208 and processing is thus shortened.

The invention claimed is:

1. A method for producing an image with a magnetic resonance imaging (MRI) system, the steps comprising:

a) acquiring in parallel a plurality of undersampled k-space data sets with the MRI system using a pulse sequence that samples k-space along non-Cartesian trajectories;

b) reconstructing coil images from the plurality of undersampled k-space data sets;

c) producing coil sensitivity maps using the coil images;

d) calculating a set of reference reconstruction coefficients for a coil using the undersampled coil k-space data and the coil sensitivity maps;

e) calculating additional reconstruction coefficients by interpolating between calculated reference reconstruction coefficients;

f) calculating additional k-space data for the undersampled k-space data set for the coil using the reference reconstruction coefficients and the additional reconstruction coefficients to form a complete coil k-space data set;

g) repeating steps d), e) and f) for each coil to produce corresponding complete coil k-space data sets;

h) reconstructing final coil images from the complete coil k-space data sets; and i) producing the image by combining the final coil images produced in step h).

2. The method as recited in claim 1 in which the coil images are combined in step i) by calculating the square root of the sum of the squares of corresponding values in the coil images.

3. The method as recited in claim 1 in which the non-Cartesian trajectory is a radial trajectory.

4. The method as recited in claim 1 in which step b) reconstructs coil images using a central region of k-space data in the undersampled k-space data sets.

5. The method as recited in claim 4 in which step c) includes:

c)i) reconstructing additional coil images using all the k-space data in the plurality of undersampled k-space data sets;

c)ii) combining the additional coil images to form a composite image; and c)iii) producing each coil sensitivity map by dividing the corresponding coil image by the composite image.

\* \* \* \* \*